Nov. 24, 1970 J. H. PROUT ET AL 3,543,175
VARIABLE GAIN AMPLIFIER
Filed July 24, 1969 2 Sheets-Sheet 1

INVENTORS
JAMES H. PROUT
GEORGE A. BOYER
BY
Thomas G. Keough
Ervin F. Johnston
ATTORNEYS

VARIABLE GAIN AMPLIFIER

Filed July 24, 1969

2 Sheets-Sheet 2

INVENTORS
JAMES H. PROUT
BY GEORGE A. BOYER

Thomas G. Keough
Ervin F. Johnston
ATTORNEYS

United States Patent Office 3,543,175

Patented Nov. 24, 1970

3,543,175

VARIABLE GAIN AMPLIFIER

James H. Prout, State College, and George A. Boyer, Woodward, Pa., assignors, by mesne assignments, to the United States of America as represented by the Secretary of the Navy Filed July 24, 1969, Ser. No. 844,542

Int. Cl. H03g 3/30

U.S. Cl. 330—29 1 Claim

ABSTRACT OF THE DISCLOSURE

A plurality of field effect transistors connected in pairs in a cascode configuration produce output signals within a predetermined sweep through interconnected drain circuits to prevent phase-shifting DC currents from reaching bandwidth control circuits. By blocking these currents, the bandwidth control components ensure a consistent phase relationship over a desired pass-band. An interface circuit, composed, in part, of a pair of serially connected operational amplifiers, passes biasing control signals to the gate of one of each of the paired, cascoded field effect transistors to vary its transconductance, and, hence, the sweep limits of the variable gain amplifier output. The biasing controlling signals fed to the gates are derived by a remotely located envelope level detector circuit to effectively vary the transconductance of the field effect transistors to provide an output signal within predetermined parameters irrespective of the excursions of the circuit input signals caused by high and low frequency noise.

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

Briefly, the invention is directed to an improvement in the field of the high gain amplifiers that ensure a stable output signal over a specified pass-band irrespective of considerable input signal magnitude variation due to frequency noise and excursion signals. All existing amplifiers employing conventional circuits and elements are faced with phase shift problems when input signals of widely differently discrete values drive the active elements, usually transistors or vacuum tubes, to operate at widely separated levels on their gain-bias characteristic curves. A further complication in conventional circuits becomes apparent when the DC component or spurious signals are fed to band-pass circuits, since the permeability of inductors, in particular iron core inductors, changes in proportion to varying DC components to change the circuit reactance and, hence, to result in bandwidth phase shifts. A limitation of most contemporary circuits resides in the fact that when originally designed to operate handling input currents within a first set of limits, extensive modification, involving addition, subtraction, or changing components, is necessitated when signals having widely separated input levels are processed.

SUMMARY OF THE INVENTION

The present invention is directed to providing an externally controlled high gain amplifier formed of amplifier stages including pairs of cascode connected field effect transistors impressing an output signal on a drain circuit providing a low DC resistance and on a bandwidth limiting circuit formed of components ensuring a minimal phase shift. A control signal, derived from the original input signal by an operational amplifier interface circuit, is fed to the gates of one of each of the field effect transistor pairs to control the pairs' transconductance, and, consequently regulate the magnitude of the output signal irrespective of the magnitude of the original input signal.

Therefore, it is an object of the present invention to provide a stable, high gain amplifier.

Another object is to provide the variable gain amplifier capable of processing large excursion input signals.

Yet another object is to provide a high gain amplifier having its gain controlled by an external DC bias control signal derived fro mthe amplifier input signal.

Yet another object is to provide an amplifier having its gain externally controlled without requiring a change of internal components when encountering widely fluctuating input signals.

Another object is to provide an amplifier introducing minimal phase shift over a considerably wide pass-band.

These and other objects of the instant invention will become readily apparent from the ensuing description when taken with the drawings.

PREFERRED EMBODIMENT OF THE INVENTION

Figure 1:
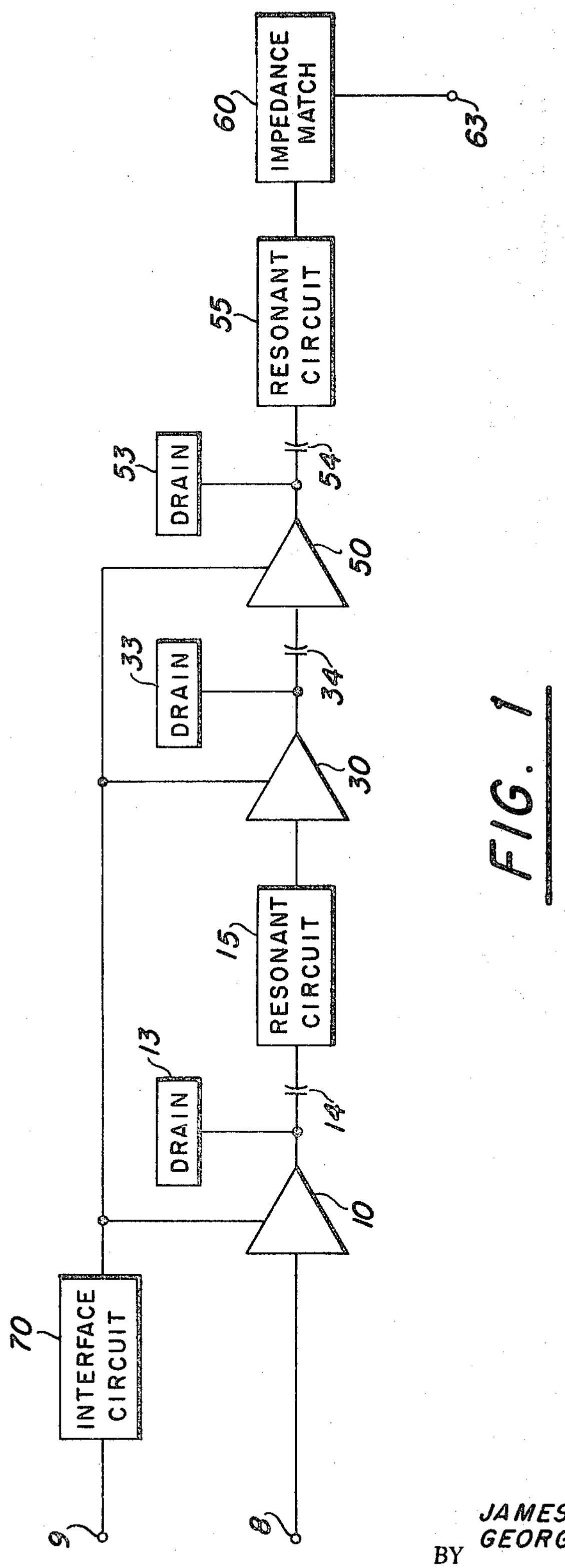
FIG. 1 is a block diagram of the invention.
Figure 2:
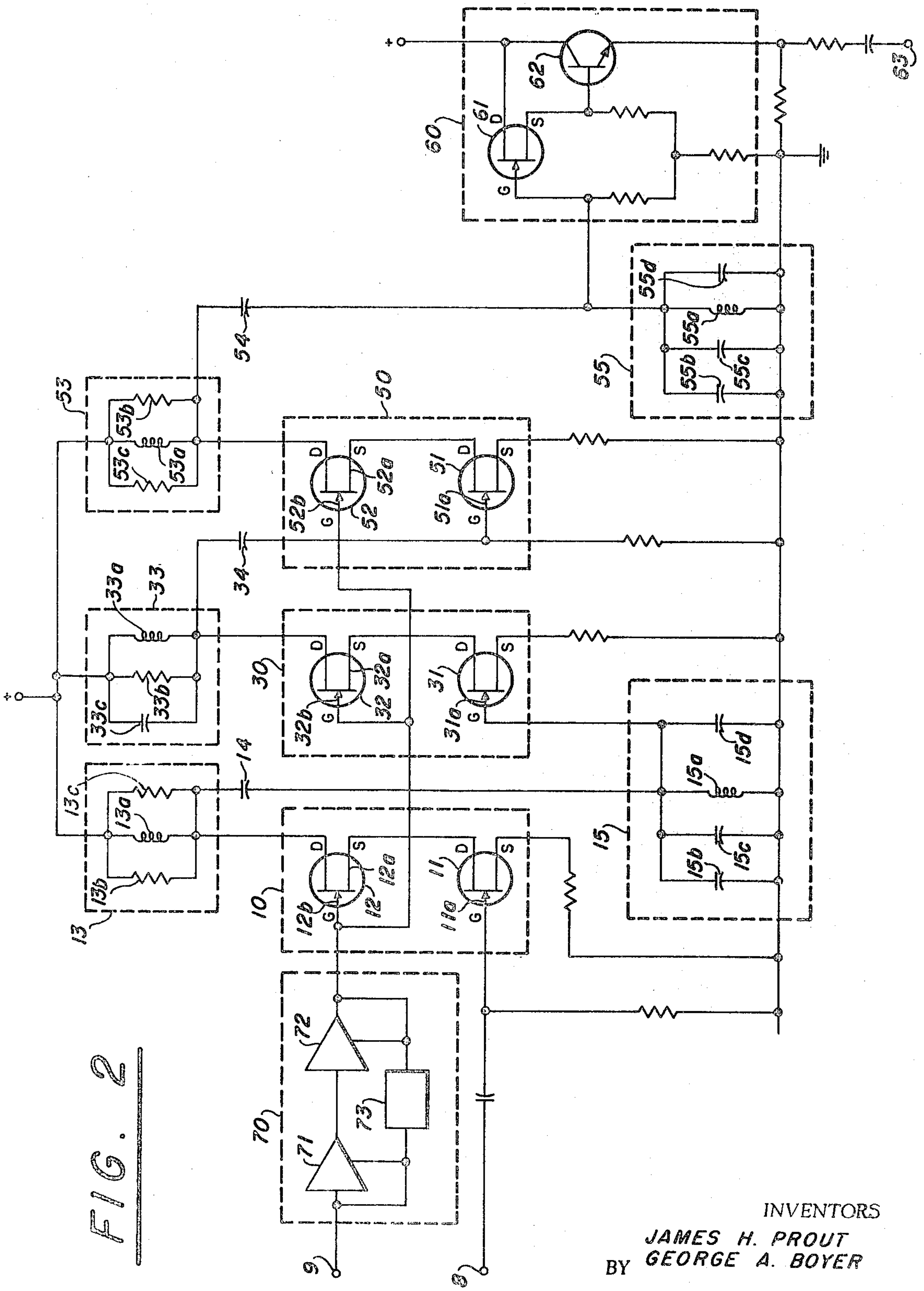
FIG. 2 shows a schematic diagram of the invention.

Referring now to the drawings, showing a representative embodiment, an input terminal 8 feeds input signals to three amplifying stages 10, 30, and 50, each containing as principal active elements, a pair of field effect transistors 11 and 12, 31 and 32, or 51 and 52, respectively. Within each amplifier stage, the pairs are connected in the cascode relationship, noting the upper field effect transistors 12, 32, and 52, each having a substantially grounded source terminal 12*a*, 32*a*, and 52*a* followed by a substantially grounded gate 11*a*, 31*a*, and 51*a* output stage to provide an amplifier stage having an inherently high gain, high input impedance, and low noise.

A drain circuit 13, 33, or 53 is connected to respectively receive output signals from a single amplifying stage. Each drain circuit provides, via a large inductance 13*a*, 33*a*, or 53*a*, a low DC resistance and a high AC impedance for the output of a preceding amplifier stage to effectively drain off DC and low frequency components appearing on the preceding amplifier stage output. The swamping resistors 13*b*, 35*b*, and 53*b* taken with selected trimming resistors 13*c* and 53*c* and a trimming capacitor 33*c* are selected to ensure precise phase balancing and to give the required overall band-pass through the drain circuits.

A coupling capacitor 14, 34, or 54 joins individual amplifier stages to following circuitry to block a DC current, varying in accordance with an input signal impressed across the preceding amplifier stage, from eventually reaching either one of the two resonant circuits 15 or 55 formed of an inductor 15*a* taken with capacitors 15*b*, 15*c*, and 15*d*, or an inductor 55*a* taken with capacitors 55*b*, 55*c*, and 55*d* respectively.

The DC component in the signal must be prevented from passing to the resonant circuits since this component creates a permeability change in the resonant circuit inductors 15*a* or 55*a*, to modify the bandwidth and phase characteristics of the two resonant circuits. Capacitors 15*d* and 55*d* are trimming capacitors, which taken with other capacitors electronically cooperate with the resonant circuit inductors to provide the desired center frequency of the output bandwidth, which, in the present case dealing with a representative high frequency application, is in the high audio frequency region.

Since a substantially high output impedance is presented by the amplifier stages, drain circuits, and resonance circuits, an impedance matching circuit 60 including transistors 61, and 62, is respectively connected in a source follower and emitter follower configuration, not to add to the overall circuit gain, but provide a high impedance load to the final amplifying stage and a low impedance source at the output terminal 63 for driving external circuitry.

To ensure a high gain amplifier having a large input signal variation capability, a control input terminal 9 is adapted to receive envelope control signals derived from the identical input signals appearing on signal input terminal 8 and by a remotely located envelope detector.

Following the control input terminal, an interface circuit 70, including a pair of operational amplifiers, 71 and 72, and their operatively associated resistive-capacitive feedback circuitry, schematically represented by block 73, receives the envelope control signals. Block 73 and its leads connected to the operational amplifiers only schematically represent feedback loops serving to stabilize the operational amplifiers. It is well-known that the application of a feedback, in particular a negative feedback, around a high gain operational amplifier produces a circuit with a precisely regulated gain characteristic, depending only on the feedback used. Thus, it naturally follows, that by the routine selection of the proper feedback network and components, the operational amplifiers are employed to add, subtract, average, indicate, or differentiate. The only prerequisites for selecting the proper feedback components are knowing the signal strengths involved and a good working knoweldge of a particular amplifier's characteristics. Here, the envelope control signals are received by interface circuit 70 which generates gate-bias control signals by including practical feedback circuits based on well-known circuits disclosed in, for example, the "Handbook of Operational Amplifier Applications" (first edition) by Burr-Brown Research Corporation of Tucson, Ariz. or by the publication "Applications Manual for Operational Amplifiers" (A Library of Practical Feedback Circuits), copyright 1968 by Philbrick/Nexis Research, A Teledyne Company, Dedham, Mass. In the instant utilization, gate-bias control signals are generated in the interface circuit driving the cascoded FET's within predetermined limits on a desired portion of the FET'S gain-bias characteristic curve. Since FET gain or transconductance is a function of both the drain potential and the applied bias signal, the generated gate-bias control signals fed to each of the gates 12*b*, 32*b*, and 52*b* responsively regulate the conductance of each of the amplifier stages according to predetermined output parameters governed by the operational limits of the field effect transistors and the drain potential. In a representative embodiment, a pair of $\mu$A709 operational amplifiers are used having resistive-capacitive feedback loops feeding desired gate-bias control signals to M101 FET's. Input signals in a 4 kHz. pass-band having a magnitude of —113 db v. included up to —43 db v. of noise to produce an output signal having a 70 db gain. Suitable supply potentials of +28 v. DC, and ±28 v. DC were respectively provided for the interface circuit, the amplifier stages, and impedance matching and the other components were determined as a matter of design choice by the magnitude of the input signals, the desired magnitude and phase relationship of the output signals, and the components at hand.

In operation, after a circuit has been constructed in the manner set forth above and the bandwidth determined by the resonant circuits and drain circuits, db amplification from a high gain through zero to a negative gain is externally controlled by the envelope control signals applied to the control input terminal 9. An input signal appearing at input terminal 8 is fed to the gate 11*a* and the first stage, 10; amplification of an output signal varies in accordance with the gate-bias control signal impressed on the gate 12*b* as it was generated in interface circuit 70.

In each stage, 10, 30, or 50, the input signal is applied to the gate of the lower transistor, 11*a*, 31*a* or 51*a*, and a gate-bias control voltage, derived from the input signal, is applied to the gate of the upper transistor 12*b*, 32*b*, or 52*b* and, thus, since each amplifier stage is interconnected in the cascode configuration, the gate-bias control signal varies the overall transconductance of the amplifier stages accordingly. Since a considerably large component of the composite signal produced by the input signal and the gate-bias control signal is attributed to low frequency noise and a DC component, the drain circuits, by including a high inductance, 13*a*, 33*a*, or 55*a*, provide a low DC resistance and a high AC impedance for passing off these undesired signals. The coupling capacitors, 14, 34, and 54, providing a low AC impedance, block the DC component from reaching following resonant circuits. This blocking has a twofold advantage for the DC component adversely affects the permeability of the resonant circuit inductors, 15*a* and 55*a*, resulting in an undesired bandwidth shift and signal phase shift.

By the electronic cooperation of the drain circuit, the coupling capacitors and the resonant circuits, an undistorted signal, shifted 180° with respect to the input, within a pre-determined band-pass amplified and fed to the output terminal.

In other applications where bandwith and/or phase relationship have different priorities, an additional resonant circuit receives the second stage output or, if the tuned circuits are eliminated, the pass-band is determined by the drain circuits.

Obviously, many modifications and variations of the present invention are possible in the light of the above teachings, and, it is therefore understood that within the scope of the disclosed inventive concept, the invention may be practiced otherwise than as specifically described.

What is claimed is:

1. An externally controlled high gain amplifier ensuring minimal phase shift for widely fluctuating input signals comprising:

a signal input terminal;

a plurality of amplifying stages being connected with respect to each other in a cascode relationhship and coupled to said input terminal for amplifying input signals according to predetermined parameters, each said amplifying stage including a pair of field-effect transistors each having a gate, source, and drain, the first of which has its gate connected to receive said input signals, the second of which has its gate connected to receive gate-bias control signals for varying each stage's transconductance, and said pair being interconnected in a cascode configuration;

a plurality of drain circuits each connected to a drain of a separate second field-effect transistor being formed of elements to provide a low DC resistance and a high AC impedance through a predetermined bandwidth;

a plurality of resonant circuits formed of elements for passing said predetermined bandwith with a minimal phase shifting therethrough;

a plurality of coupling capacitors, a separate one of which connecting separate drain circuits to separate resonant circuits to pass said amplified input signals and block a DC component thereof from the resonant circuits;

an external control input terminal;

an interface amplifying means connecting said external control input terminal to the gate of each first field-effect transistor and being formed of components for ensuring the derivation and transfer of gate-bias control signals for driving each said amplifying stage within predetermined limits on its gain bias curve;

an output terminal joined to the output of the last cascaded amplifying stage for passing amplified signals within said predetermined bandwidth and with said minimal phase shifting; and a source-follower-emitter-follower stage interposed between the last said amplifying stage and said output terminal including circuit components for impedance matching for following circuitry.

References Cited

UNITED STATES PATENTS

| | | | |
|---|---|---|---|
| 3,260,948 | 7/1966 | Theriault | 330—18 |
| 3,401,349 | 9/1968 | Mitchell | 330—35 X |
| 3,404,347 | 10/1968 | Kaplan et al. | 330—35 X |
| 3,449,686 | 6/1969 | Bladen | 330—35 X |

OTHER REFERENCES

Knighton, "Single Transistor Rectifies AGC Signal," Electronics, Jan. 8, 1968, p. 90.

Randall, "FET Voltmeter," Electronics World, February 1967, p. 63.

ROY LAKE, Primary Examiner

JAMES B. MULLINS, Assistant Examiner

U.S. Cl. X.R.

330—20, 35